United States Patent
Shiau et al.

(10) Patent No.: US 7,348,866 B2
(45) Date of Patent: Mar. 25, 2008

(54) COMPACT PRINTED FILTERS WITH SELF-CONNECTED LC RESONATORS

(75) Inventors: Ming-Jong Shiau, Cerritos, CA (US); Phu H. Tran, Huntington Beach, CA (US); Alex T. Chau, Rancho Palos Verdes, CA (US); Mark Kintis, Manhattan Beach, CA (US); George W. Schreyer, Torrance, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 145 days.

(21) Appl. No.: 11/268,413

(22) Filed: Nov. 2, 2005

(65) Prior Publication Data

US 2007/0146098 A1 Jun. 28, 2007

(51) Int. Cl.
*H03H 7/01* (2006.01)

(52) U.S. Cl. ............ 333/168; 333/175; 333/185

(58) Field of Classification Search ........... 333/168, 333/175, 185, 176
See application file for complete search history.

(56) References Cited

U.S. PATENT DOCUMENTS

| | | | |
|---|---|---|---|
| 2,915,716 A | 12/1959 | Hattersley | |
| 4,881,050 A | 11/1989 | Swanson, Jr. | |
| 5,618,777 A * | 4/1997 | Hey-Shipton et al. | 505/210 |
| 6,175,727 B1 | 1/2001 | Mostov | |
| 6,734,760 B2 * | 5/2004 | Tsujiguchi | 333/172 |
| 6,792,299 B2 * | 9/2004 | Ye | 505/210 |

OTHER PUBLICATIONS

Nguyen N. M. et al; Si IC-Compatible Inductors and LC Passive Filters; IEEE Journal of Solid-State Circuits; Aug. 1, 1990; pp. 1028-1031; vol. 25, No. 4; IEEE Service Center, Piscataway, New Jersey, USA.

* cited by examiner

*Primary Examiner*—Benny Lee
(74) *Attorney, Agent, or Firm*—Carmen B. Patti & Assoc., LLC

(57) ABSTRACT

An LC filter structure and method for its fabrication, in which multiple shunt capacitors, multiple shunt inductors and multiple coupling inductors are printed on a metal layer formed on a thin dielectric substrate. The capacitors have first electrodes that are formed as spatially separated regions of the metal layer, and a common second electrode formed by a ground plane on the substrate. The shunt inductors are formed as spiral traces connected to the separated regions and to the ground plane, through conductive vias. The coupling inductors are similarly formed as spiral traces in the gaps between the separated regions, the ends of each coupling inductor being connected to respective adjacent regions of the metal layer.

13 Claims, 2 Drawing Sheets

COMPACT PRINTED FILTERS WITH SELF-CONNECTED LC RESONATORS

GOVERNMENT RIGHTS

This invention was made with Government support under contract number F33657-03-C-4318 awarded by the United States Air Force. The Government has certain rights in this invention.

BACKGROUND OF THE INVENTION

This invention relates generally to radio-frequency (RF) filters and, more particularly, to RF filters used at microwave frequencies in various applications, such as communication systems. Filters are necessary components of communication systems and in other RF systems. Typically, a filter includes one or more inductors and one or more capacitors in combination to provide a desired frequency filtering function. Such a filter is often referred to as an LC filter, since the letters L and C are often used in circuits to refer to inductors and capacitors, respectively.

Although the capacitance and inductance parameters of a filter may be uniformly distributed in a physical structure, in practice filters typically employ "lumped" elements connected together to perform the filter function. A capacitor in a lumped LC filter may take the form of a chip capacitor, and a lumped inductor usually takes the form of a coil of conductive material. Coupling these components together is effected by ribbon bonding techniques, which are necessarily very labor intensive and result in a higher cost. An even more serious drawback of lumped element LC filters of the prior art is that the variations in L and C values in typical lumped inductors and capacitors may be greater than 10 percent. The uncertainty of L and C values, and repeatability of extensive ribbon bondings, severely degrade the unit-to-unit tracking performance.

Accordingly, there is a need for an LC filter structure that is not subject to these well known disadvantages of lumped impedance LC filters. The present invention is directed to this end.

SUMMARY OF THE INVENTION

The present invention resides in an LC lumped element filter in which the resonator elements are self-connected and the filter requires much less ribbon bonding. This results in a low cost and a high degree of repeatable accuracy. Briefly, and in general terms, the invention may be defined as an inductive-capacitive (LC) filter, comprising a dielectric substrate having first and second opposing faces; a patterned metal layer formed on the first face of the substrate; a ground plane formed on the second face of the substrate; at least one shunt capacitor having a first electrode formed by a selected region of the metal layer and a second electrode formed by the ground plane; and at least one inductor that is formed integrally with the metal layer. The shunt capacitor and the inductor are, therefore, integrated into the filter structure without external ribbon connections.

More specifically, the filter comprises a plurality of shunt capacitors having first electrodes formed by separate regions of the metal layer; and there is at least one shunt inductor having its ends connected, respectively, to one of the separate regions of the metal layer and to the ground plane; and at least one coupling inductor having its ends connected to adjacent separate regions of the metal layer.

More particularly, a preferred embodiment of the inductive-capacitive (LC) filter of the invention comprises a dielectric substrate having first and second opposing faces; a patterned metal layer formed on the first face of the substrate as a plurality of segments that are spaced apart; a ground plane formed on the second face of the substrate; a plurality of shunt capacitors; a plurality of shunt inductors and a plurality of coupling inductors. Each of the shunt capacitors is formed between one segment of the patterned metal layer and the ground plane. Each of the shunt inductors is formed as a spiral metal trace in the patterned metal layer, with one end of the spiral metal trace electrically connected to one segment of the metal layer and the other end of the spiral metal trace connected to the ground plane through a plated via hole through the substrate. Each of the coupling inductors is also formed as a spiral metal trace in the patterned metal layer, between adjacent ones of the segments of the patterned metal layer, the ends of the spiral metal trace being electrically connected internally or externally to the adjacent segments.

In the preferred embodiment of the invention, each of the shunt inductors further comprises a conductive metal trace connecting one end of the inductor to a segment of the metal layer, and a conductive via for making electrical connection between the opposite end of the inductor and the ground plane; and each of the coupling inductors further comprises a conductive metal trace connecting one end of the inductor to one segment of the metal layer, and a ribbon bond or airbridge for making electrical connection between the opposite end of the inductor and an adjacent segment of the metal layer.

The invention may also be defined in terms of a method for fabricating an inductive-capacitive (LC) filter. The method comprises the steps of taking a dielectric substrate having opposing first and second faces; forming a metal layer on the first face of the substrate; forming a ground plane on the second face of the substrate; and patterning the metal layer to form (a) a plurality of regions that are spatially separated by gaps, where each region is sized to provide a desired capacitance value in cooperation with the ground plane and intervening dielectric substrate, (b) a plurality of shunt inductors, each formed within an otherwise uninterrupted region of the metal layer, and (c) a plurality of coupling inductors in the gaps between adjacent regions. The method further comprises the steps of forming, as part of the patterning step, an electrical connection between each shunt inductor and the region of the metal layer in which it is formed, and electrical connections between one end of each coupling inductor and one of the adjacent regions of the metal layer; forming a conductive via connection between each shunt inductor and the ground plane; and forming a conductive via, ribbon bond or airbridge connection between another end of each coupling inductor and the other of the adjacent regions of the metal layer.

It will be appreciated from the foregoing that the present invention represents a significant advance in the field of RF lumped element LC filters. In particular, the invention provides a filter that is more accurate, more reliable, and less costly than prior RF filters for the same purpose. Other aspects and advantages of the invention will become apparent from the following more detailed description, taken in conjunction with the drawings.

DETAILED DESCRIPTION OF THE INVENTION

Figure 1:
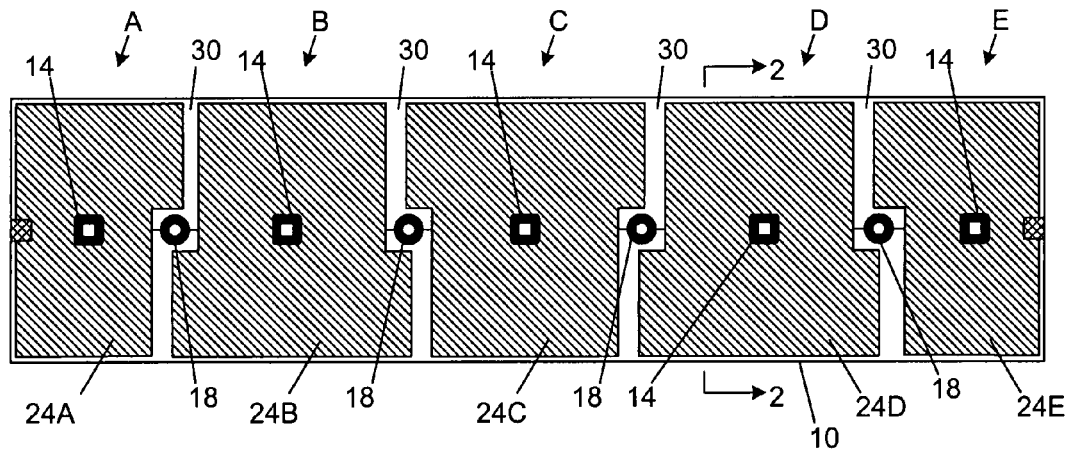
FIG. 1 is a plan view of a five-pole RF filter structure implemented in accordance with the present invention.

As shown in the drawings for purposes of illustration, the present invention is concerned with LC (inductive-capacitive) lumped element radio-frequency (RF) filters. In conventional lumped element filters, capacitive and inductive components were separately fabricated and then connected by ribbon bonding.

In accordance with the present invention, a lumped element LC filter is completely integrated into a structure that requires much less ribbon bonding to connect capacitive and inductive components. All capacitive and shunt inductive components of the filter are formed together and may be characterized as self-connected.

Figure 3:
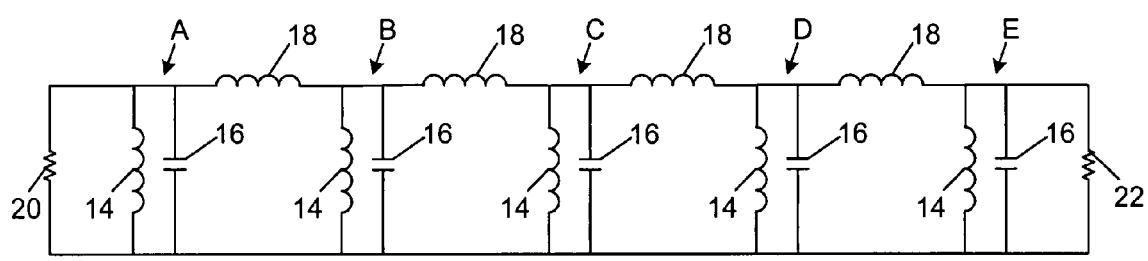
FIG. 3 is an equivalent circuit diagram of the filter structure of FIG. 1.

As shown in FIG. 1, for example, a filter in accordance with the invention may take the form of a multiple-pole filter, or as illustrated, a five-pole, filter. In this example, the filter includes metallized structure formed on a substrate (indicated by reference numeral 10) of alumina that is of 5 mil thickness (0.005 inch, or approximately 130 µm). Each of five filter stages, indicated as A, B, C, D and E, includes a shunt inductor 14, as indicated both in FIG. 1 and in the equivalent circuit diagram of FIG. 3, and a shunt capacitor 16, as indicated in FIG. 3. The structure further includes four coupling inductors 18 between the successive stages A and B, B and C, C and D, and D and E as shown in FIGS. 1 and 3. As indicated by an input impedance 20 and an output impedance 22 in the equivalent circuit of FIG. 3, the filter structure may be designed to present a uniform characteristic impedance between its input and output ports.

Figure 2:
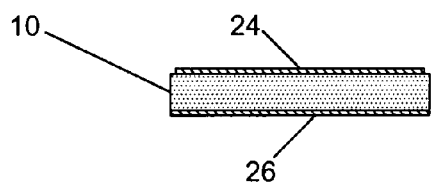
FIG. 2 is a cross-sectional view of the filter structure of FIG. 1, taken generally along the line 2-2 in FIG. 1.

As shown by the cross-sectional view of FIG. 2, the filter structure basically comprises the substrate 10, a patterned metal layer 24 on one surface, depicted as the upper surface, and metal ground plane 26 on its opposite surface, depicted as the lower surface. The metal layer 24 is patterned to form all of the shunt inductors 14 and capacitors 16, as well as the coupling inductors 18 as shown in FIG. 1. More specifically, as shown in FIG. 1, the shunt capacitors 16 are formed by etching gaps 30 in the metal layer 24 between the filter stages, such that the remaining portions of the metal layer define upper plates or electrodes 24A, 24B, 24C, 24D and 24E of the capacitors 16. Each such capacitor 16 is defined by one of these electrodes, together with the ground plane 26 and the intervening dielectric material of the substrate 10. A shunt inductor 14 is formed approximately in the center of each of the metal plates 24A-24E. The specific form of each inductor 14 is further discussed below, but in brief it follows a spiral configuration with one end connected to the metal layer 24 and the other end connected to the ground plane 26. The coupling inductors 18 also follow a spiral configuration, with one end connected to one of the metal areas, such as 24A, and the other end connected to an adjacent metal area, such as 24B. As illustrated in FIG. 1, the gaps 30 in the metal layer 24 may not be of uniform width, but may be widened near their mid-points to accommodate the structure of the coupling inductors 18. The area of each metal area 24A-24E must, of course, be selected to provide the desired capacitance value for the shunt capacitors 16. Maintaining the gaps 30 as narrow as possible, consistent with accommodating the coupling inductors 18, results in a more compact structure for the filter.

Figure 4:
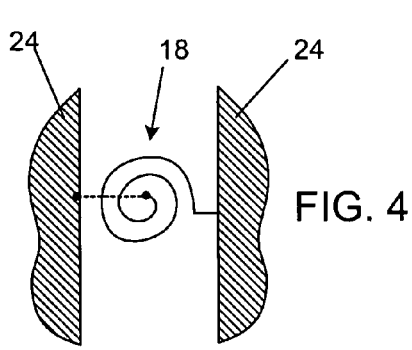
FIG. 4 is an enlarged fragmentary view of a coupling inductor used in the filter structure of FIG. 1.
Figure 5:
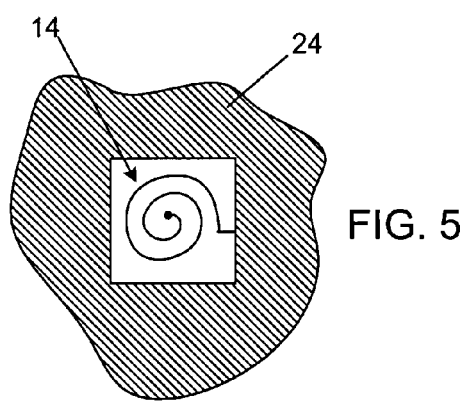
FIG. 5 is an enlarged fragmentary view of a shunt inductor used in the filter structure of FIG. 1.

As best shown in FIGS. 4 and 5, the shunt inductors 14 (see FIG. 5) and the coupling inductors 18 (see FIG. 4) are formed by etching away portions of the metal layer 24 to form inductive coils on the surface of the substrate 10. In particular, each coupling inductor 18 takes the form of a conductive spiral coil formed in a gap 30 between two successive stages of the filter. The ends of the spiral coil are coupled, respectively to portions of the layer 24 on opposite sides of the gap 30, such as the portions 24A and 24B in FIG. 1. As illustrated in FIG. 4, each series inductor 18 has its outer end internally connected to the right-hand metal layer 24 and its inner end externally connected to the left-hand metal layer 24. The dotted line in FIG. 4 indicates that the external connection is via ribbon bond or airbridge. As shown in FIG. 5, each shunt inductor 14 has its outer end connected to the metal layer 24 and its inner end connected through a plated via (the solid dot in the center of the coil 14). This via makes connection between the central end of the coil 14 and the ground plane 26. Although the inductors 14 and 18 are shown as being approximately circular spirals, they could equally well take the form of rectangular or square spirals.

The filter structure of the invention is no limited to any critical physical dimensions. By way of example, the substrate 10 may be of alumina and of thickness 0.005 inch (approximately 130 µm) and width 0.192 inch (approximately 5 mm). The five-pole filter structure described may be implemented in a device of this width and thickness, in a length of 0.756 inch (approximately 1.92 cm).

Figure 6:
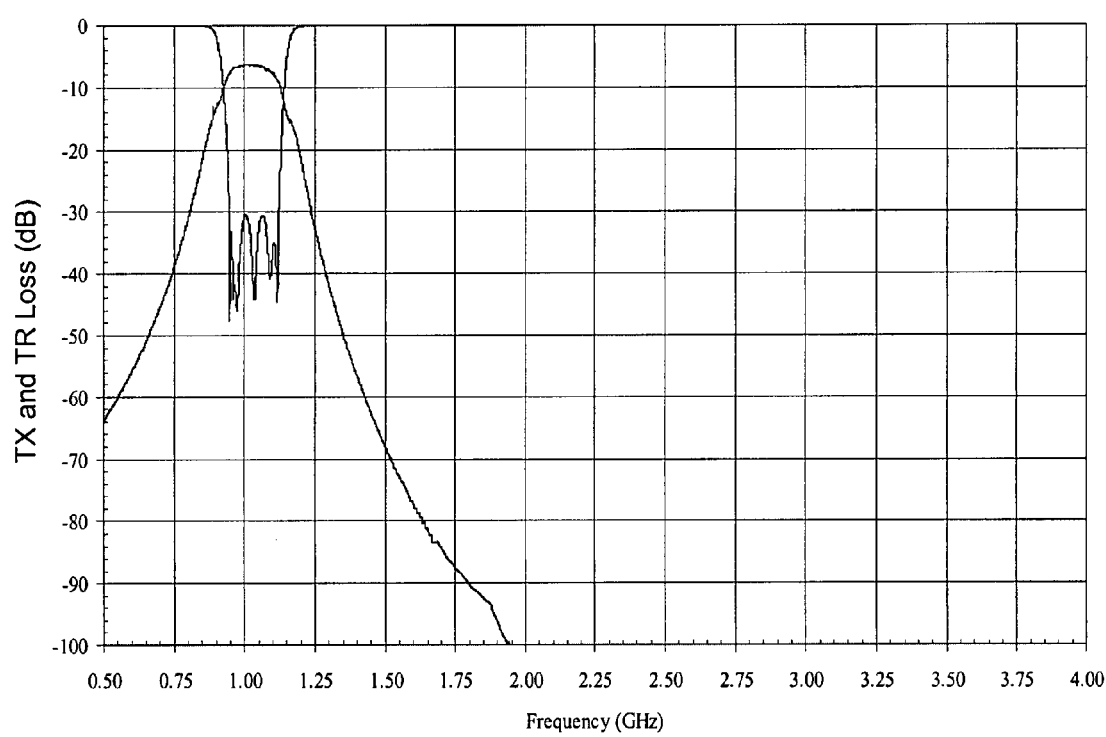
FIG. 6 is a pair of graphs plotting the insertion loss and return loss performance of a filter in accordance with the invention.

FIG. 6 shows the simulated performance characteristics of a 1 GHz passband filter implemented in accordance with the present invention. The lower curve shows the insertion loss of the filter over a wide frequency range, including a relatively narrow passband centered at 1 GHz. The upper curve is the corresponding return loss curve for the filter.

It will be appreciated from the foregoing that the invention provides significant advantages over prior art filters. In particular, the filter of the invention provides improved performance in terms of more accurate circuit element values, reduced errors arising from assembly problems, and more predictable RF performance. Furthermore, the improved performance is achieved together with a substantial reduction in cost because of the use of printed circuit elements and minimizing the use of ribbon connectors. This manufacturing technique also results in RF filters of reduced overall size. It will also be appreciated that, although the invention has been described and illustrated in detail by way of example, various modifications may be made without departing from the spirit and scope of the invention. Accordingly, the invention should not be limited except as by the accompanying claims.

The invention claimed is:

1. An inductive-capacitive (LC) filter, comprising:
   a dielectric substrate having first and second opposing faces;
   a patterned metal layer disposed on the first face of the substrate;
   a ground plane disposed on the second face of the substrate;

at least one shunt capacitor having a first electrode provided by a selected region of the metal layer, and a second electrode provided by the ground plane; and at least one inductor provided integrally with the metal layer;

wherein the shunt capacitor and the inductor are integrated into the filter without external ribbon connections;

wherein the at least one inductor comprises at least one shunt inductor provided as a metal trace within the selected region of a corresponding shunt capacitor.

2. An inductive-capacitive (LC) filter as defined in claim 1, wherein:

the filter comprises a plurality of shunt capacitors having first electrodes provided by separate regions of the metal layer, wherein the plurality of shunt capacitors comprise the at least one shunt capacitor; and the at least one inductor comprises at least one shunt inductor having thereof connected, respectively, to one of the separate regions of the metal layer and to the ground plane, and at least one coupling inductor having thereof connected to adjacent separate regions of the metal layer.

3. An inductive-capacitive (LC) filter as defined in claim 1, wherein:

adjacent regions of the metal layer are separated by the gaps that include a portion that is widened to accommodate coupling inductors and other portions that are narrowed as needed to minimize device length and obtain desired shunt capacitor values.

4. An inductive-capacitive (LC) filter, comprising:

a dielectric substrate having first and second opposing faces; a patterned metal layer disposed on the first face of the substrate as a plurality of segments that are spaced apart;

a ground plane disposed on the second face of the substrate;

a plurality of shunt capacitors, wherein each shunt capacitor is provided between a respective segment of the patterned metal layer and the ground plane;

a plurality of shunt inductors, wherein each shunt inductor is provided as a respective spiral metal trace in a respective segment of a corresponding shunt capacitor, wherein one end of the respective spiral metal trace is electrically connected to the corresponding segment of the metal layer and the other end of the respective spiral metal trace is connected to the ground plane through a corresponding plated via hole disposed through the substrate; and a plurality of coupling inductors, wherein each coupling inductor is provided as a respective spiral metal trace in the patterned metal layer, disposed between adjacent ones of the segments of the patterned metal layer and having inner and outer ends thereof coupled, respectively, to the adjacent segments.

5. An inductive-capacitive (LC) filter as defined in claim 4, wherein:

each of the shunt inductors further comprises a respective conductive metal trace connecting one end of the corresponding inductor to a segment of the metal layer, and a respective conductive via for making electrical connection between the opposite end of the corresponding inductor and the ground plane; and each of the coupling inductors further comprises a respective conductive metal trace connecting the outer end of the corresponding inductor to one segment of the metal layer, and a respective conductive structure for making electrical connection between the inner end of the corresponding inductor and an adjacent segment of the metal layer.

6. An inductive-capacitive (LC) filter as defined in claim 5, wherein the respective conductive structure making connection to the inner end of the corresponding coupling inductor comprises an airbridge.

7. An inductive-capacitive (LC) filter as defined in claim 5, wherein:

the dielectric substrate is of alumina.

8. An inductive-capacitive (LC) filter as defined in claim 5, wherein:

adjacent segments of the metal layer are separated by gaps that include a portion that is widened to accommodate the corresponding coupling inductors and other portions that are narrowed as needed to minimize device length and obtain desired shunt capacitor values.

9. An inductive-capacitive (LC) filter as defined in claim 5, wherein the respective conductive structure making connection to the inner end of the corresponding coupling inductor comprises a ribbon bond.

10. A method for fabricating an inductive-capacitive (LC) filter, comprising:

providing a dielectric substrate having opposing first and second faces;

forming a metal layer on the first face of the substrate;

forming a ground plane on the second face of the substrate;

patterning the metal layer to form (a) a plurality of metal regions that are spatially separated by non-conductive gaps, wherein each region is sized to provide a desired capacitance value in cooperation with the ground plane and the dielectric substrate, (b) a plurality of shunt inductors, each formed within each region of the plurality of regions, and (c) a plurality of coupling inductors in the gaps between adjacent regions;

forming, as part of the patterning step, an electrical connection between each shunt inductor and the corresponding region of the metal layer in which it is formed, and electrical connections between a first end of each coupling inductor and one of the adjacent regions of the metal layer;

forming a respective conductive via connection between each shunt inductor and the ground plane; and forming a respective conductive connection between a second end of each coupling inductor and the other of the adjacent regions of the metal layer.

11. A method as defined in claim 10, wherein the step of forming a conductive connection with the second end of each coupling inductor comprises forming an airbridge.

12. A method as defined in claim 10, wherein the step of patterning the metal layer to form the plurality of regions that are spatially separated by the gaps comprises patterning the metal layer to form the gaps that include a portion that is widened to accommodate the corresponding coupling inductors and other portions that are narrowed as needed to minimize device length and obtain the corresponding desired capacitance values.

13. A method as defined in claim 10, wherein the step of forming a conductive connection with the second end of each coupling inductor comprises making a ribbon bond connection.

* * * * *